(12) United States Patent
Hartjes et al.

(10) Patent No.: US 9,423,590 B2
(45) Date of Patent: Aug. 23, 2016

(54) LIQUID COOLED EUV REFLECTOR

(71) Applicant: Carl Zeiss SMT GmbH, Oberkochen (DE)

(72) Inventors: Joachim Hartjes, Aalen (DE); Damian Fiolka, Oberkochen (DE); Boaz Pnini-Mittler, Heuchlingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 209 days.

(21) Appl. No.: 14/024,286

(22) Filed: Sep. 11, 2013

(65) Prior Publication Data

US 2014/0071523 A1 Mar. 13, 2014

Related U.S. Application Data

(63) Continuation of application No. PCT/EP2012/054664, filed on Mar. 16, 2012.

(60) Provisional application No. 61/454,045, filed on Mar. 18, 2011.

(30) Foreign Application Priority Data

Mar. 18, 2011 (DE) .................. 10 2011 005 778

(51) Int. Cl.
*G02B 5/08* (2006.01)
*G02B 7/182* (2006.01)
(Continued)

(52) U.S. Cl.
CPC ........... *G02B 7/1815* (2013.01); *G02B 5/0891* (2013.01); *G02B 5/208* (2013.01); *G03F 7/70891* (2013.01)

(58) Field of Classification Search
CPC . G03F 7/70891; G03F 7/702; G02B 5/0891; G02B 5/08; G02B 13/143; G02B 26/0816; G02B 27/0977; G02B 7/1815; G02B 7/195; G02B 7/181; G02B 5/208; G03B 27/54
USPC .......................... 359/820, 845, 359, 850, 871
See application file for complete search history.

(56) References Cited

U.S. PATENT DOCUMENTS 5,390,228 A    2/1995  Niibe et al.
7,329,014 B2 *  2/2008  Balogh ................. B82Y 10/00
                                                359/845

(Continued)

FOREIGN PATENT DOCUMENTS

CN    1618114 A    5/2005
CN    1766739 A    5/2006

(Continued)

OTHER PUBLICATIONS

Chinese Office Action, with translation thereof, for CN Appl No. 201280024051.7, dated Mar. 10, 2015.

(Continued)

*Primary Examiner* — Bumsuk Won
*Assistant Examiner* — Collin X Beatty
(74) *Attorney, Agent, or Firm* — Fish & Richardson P.C.

(57) ABSTRACT

The invention relates to an optical element for a projection exposure apparatus for semiconductor lithography comprising an optically active surface and at least one cooling component for cooling the optical element, wherein the cooling component is connected to at least two separate cooling circuits and embodied in such a way that the optically active surface can be cooled to a greater extent in at least one partial region than in a further partial region. The invention furthermore relates to a projection exposure apparatus comprising an optical element according to the invention.

11 Claims, 7 Drawing Sheets

Figure 1:
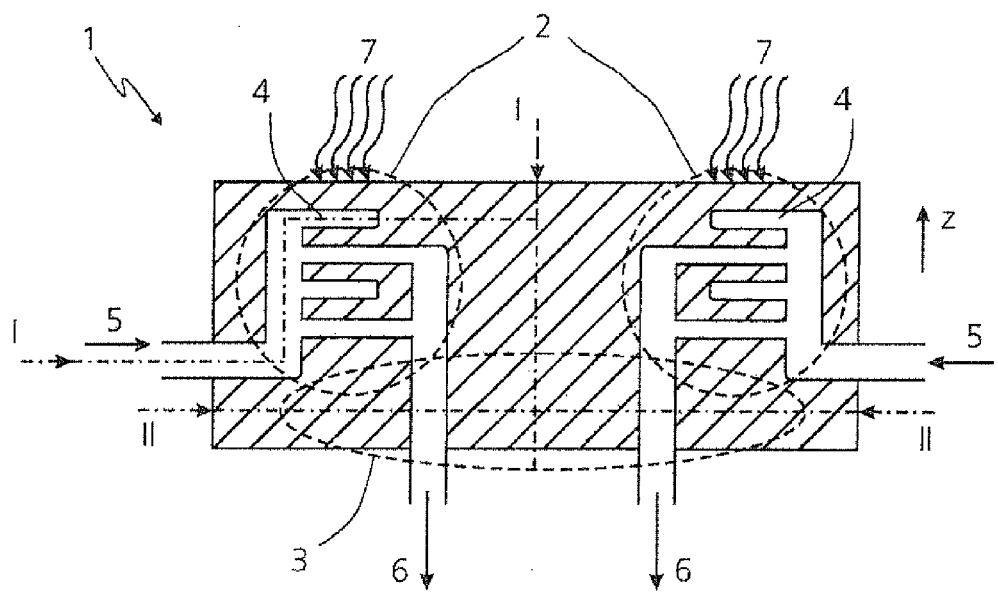
Figure 1:
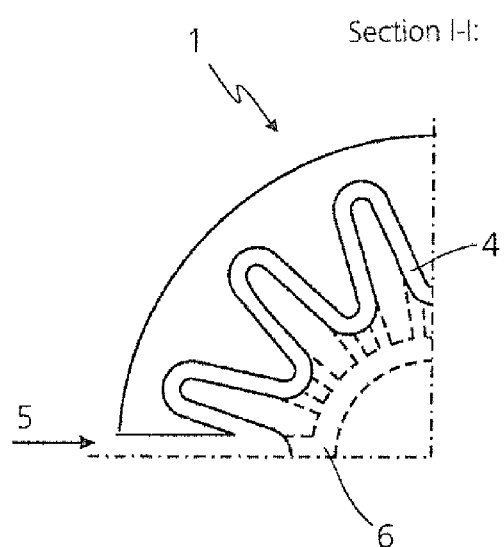

(51) Int. Cl.
*G02B 7/18* (2006.01)
*G03F 7/20* (2006.01)
*G02B 5/20* (2006.01)
*F21V 9/04* (2006.01)

(56) References Cited

U.S. PATENT DOCUMENTS

| | | |
|---|---|---|
| 8,342,701 B2 | 1/2013 | Kierey et al. |
| 2003/0169520 A1 | 9/2003 | Goldstein |
| 2004/0051984 A1 | 3/2004 | Oshino et al. |
| 2004/0264521 A1 | 12/2004 | Ness et al. |
| 2005/0073663 A1 | 4/2005 | Miyajima |
| 2006/0087637 A1 | 4/2006 | Ottens et al. |
| 2006/0119815 A1 | 6/2006 | Franken et al. |
| 2007/0091485 A1* | 4/2007 | Phillips ............... G02B 5/10 359/857 |
| 2009/0103063 A1* | 4/2009 | Nishikawa ........... B82Y 10/00 355/30 |
| 2009/0122429 A1* | 5/2009 | Watson ............... G02B 7/008 359/846 |
| 2009/0147386 A1* | 6/2009 | Sogard ............... G02B 7/1815 359/845 |
| 2009/0213345 A1 | 8/2009 | Mann |
| 2009/0296060 A1 | 12/2009 | Finders |
| 2010/0007866 A1 | 1/2010 | Warm et al. |
| 2010/0200777 A1* | 8/2010 | Hauf ............... G02B 7/1815 250/504 R |
| 2011/0181840 A1 | 7/2011 | Cobb |

FOREIGN PATENT DOCUMENTS

| | | |
|---|---|---|
| CN | 1809903 A | 7/2006 |
| CN | 101171547 A | 4/2008 |
| CN | 101790763 A | 7/2010 |
| DE | 10 2009 039 400 | 3/2011 |
| EP | 0 532 236 | 3/1993 |
| EP | 1 376 239 | 1/2004 |
| WO | WO 2009/032055 A1 | 3/2009 |
| WO | WO 2010/034472 | 4/2010 |

OTHER PUBLICATIONS

German Office Action, with translation thereof, for corresponding DE Appl No. 10 2011 005 778.1, dated Nov. 15, 2011.
International Search Report and Written Opinion for corresponding PCT Appl. No. PCT/EP2012054664, dated Aug. 14, 2012.
Taiwanese Office Action and Search Report, with translation thereof, for corresponding TW Appl No. 101109305, dated May 25, 2016.

* cited by examiner

LIQUID COOLED EUV REFLECTOR

The invention relates to optical elements having at least one optically active surface. An optical element can in this case be, in particular, an optical individual component such as e.g. a deflection mirror in an EUV illumination system for semiconductor lithography. Likewise, an optical element can also be constructed from one or from a plurality of optical individual components. By way of example, a facet mirror composed of a mirror carrying body and many individual mirror facets is hereinafter likewise designated as optical element.

The optical elements mentioned are often mounted in a larger unit, such as an EUV illumination system, for example. In this case, the optical element is a three-dimensional geometrical body which is generally delimited by a plurality of surfaces, and is used for fulfilling one or a plurality of optical functions, such as e.g. deflection or other manipulation of electromagnetic radiation. In accordance with the optical beam path, the electromagnetic radiation impinges at least on one surface of the optical elements, wherein the surface is designated here as optically active surface. The optically active surface can be subdivided into a plurality of partial surfaces, can be convexly or concavely curved in partial sections and can also contain topography jumps, as customary e.g. in the case of a diffractive optical structure. The optically active surface can always be found at a surface of the optical element, wherein the optically active surface can, inter alia, also consist of a multilayer and/or can comprise other coatings, such as e.g. also an absorber layer. The individual optical elements can be constructed from different materials and/or generally also have different component geometries. During the operation of the illumination system it is possible, moreover, to set different illumination settings, such as e.g. an annular setting, a dipole, quadrupole or some other multipole setting or else a quasar or Cquad setting. This has the consequence that, depending on the illumination setting, electromagnetic radiation impinges with locally different intensity on the optical elements. Furthermore, locally different absorber layers are applied in some optical elements under consideration here. The absorber layers are used to obtain a defined spatially resolved intensity distribution of the reflected radiation after the reflection of the EUV radiation at these optical elements. Depending on the magnitude of the absorption of EUV radiation, the energy input at the optical elements can be locally different. During the operation of the illumination system, IR radiation from other optical elements or from mechanical components can furthermore also impinge on the optical element under consideration and can be wholly or partly absorbed there. The IR radiation can, for example, also originate from a heated component—such as e.g. a so-called sigma diaphragm—which has previously absorbed EUV radiation. Overall, therefore, a locally different heat distribution can be present at the optically active surface of the optical elements. In particular, even in the case of a homogeneous or a symmetrical energy input, asymmetrical local heat distributions can also occur if e.g. the absorption properties for electromagnetic radiation differ in a spatially resolved fashion at the component. During the operation of the illumination systems, temperatures of from 100° C. to 200° C. or higher can occur in some instances in the uncooled case at the optical elements. The spatially resolved heat distribution can result in undesired deformations of the optical elements. Particularly when an illumination setting changes and in the case of a thermal loading which is constant over a specific period of time, deformations of the optical elements can occur in a temporal consideration relative to the thermally unloaded basic state at ambient temperature or some other steady-state or quasi-steady-state condition set previously.

The present invention is based on the object of specifying an optical element and a projection exposure apparatus in which the thermally induced deformations mentioned are reduced during operation.

This object is achieved via the optical element and the projection exposure apparatus comprising the features presented in the independent claims. The dependent claims relate to advantageous variants and embodiments of the invention.

For cooling the optical elements having an optically active surface, use is made of at least one cooling component which is connected to at least two separate cooling circuits. The cooling component is therefore embodied in such a way that the optically active surface can be cooled to a greater extent in at least one partial region than in a further partial region. The cooling thus counteracts the locally different radiation-induced energy input, such that deformations at the optically active surface as far as possible do not form or are otherwise at least reduced. The advantage afforded by the cooling is the avoidance of disturbing effects on the further course of the electromagnetic radiation after impinging on the optical element under consideration. The thermal loading and, in particular, the heat distribution in the components can also change over time, e.g. if the illumination setting is changed. The cooling used here, alongside the local adaptation, can now also be embodied in temporally adaptive fashion.

For analysing the local heat distributions and the local deformations of the optical elements, an FEM analysis can also be used. The results of the FEM calculations can be used, in particular, for designing the cooling systems and also for controlling the cooling system by closed-loop control and open-loop control.

The locally and temporally adaptive cooling can—e.g. depending on the set illumination setting—be effected in a locally and temporally adapted fashion at an optical element. Furthermore, the optical elements of a module can also be cooled to different extents. Thirdly, it is also possible to fit cooling bodies to the optical elements, wherein the cooling bodies have individual or a plurality of locally adapted cooling zones.

The optical element can, for example, also be a multilayer mirror for EUV lithography. In this case, the multilayer mirror can be provided with a cooling body or have a mirror carrier embodied as a cooling body. The cooling body, which here constitutes the cooling component, can be divided into different partial regions and be cooled to different extents there. Besides the option of applying the optical element to the separate cooling body, it is also possible to use the mirror carrier itself for the spatially resolved cooling of the optically active surface. In these cases, the mirror carrier is embodied as a cooling component.

The cooling body used for cooling the optical element can have one or a plurality of cooling channels arranged in different cooling zones. The optically active surface is cooled by, for example, a cooling medium flowing through the cooling channels of the different cooling zones. The cooling zones having the introduced cooling channels correspond here to the partial regions which can be cooled to different extents.

The different cooling zones can also be arranged in different planes with respect to a z-direction. The z-direction typically corresponds to the normal direction which can be assigned to the optical element on the side of the optically active surface as a whole.

The cooling channels can be connected to separate cooling circuits. This affords advantages, in particular, if the cooling in the different partial regions is performed by a locally adapted choice of the parameters which define the cooling rate. When separate cooling circuits are used, the parameters, such as the flow rate, for example, can thus be set independently of one another and be temporally changed separately for each cooling circuit.

The cooling channels can be formed by casting methods, moulding methods, eroding, etching or machining production methods.

The cooling channels can furthermore also be embodied as cooling lines connected to the cooling body. The cooling lines are thus separate components fitted to the cooling body.

The cooling lines can be connected to the cooling body for example by welding, bonding or soldering.

The cooling channels can be embodied in meandering fashion and can also have different geometries for different cooling zones. If a plurality of cooling zones are present in an optical element, the cooling zones differ with regard to the frequency of the cooling channels if the sum of the cooling channel surfaces in an imaginary volume unit is different in comparison with a further cooling zone. A different frequency is also present, for example, if a geometry section of the cooling channel within one cooling zone is repeated for example multiply periodically, wherein the number of repetitions is greater than in another cooling zone.

The optical element can also be cooled via a cooling body by virtue of the fact that the latter is in thermal contact with the optical element via connecting elements and greater cooling is achieved in one partial region by virtue of the fact that the contact area between connecting element and optical element is larger than in the further partial region. The formation of connecting elements which are adapted to the desired local cooling rate thus constitutes a further alternative with respect to cooling the optical element in different partial regions. In this case, by exchanging the connecting elements it is possible to adapt the overall configuration of the system to new conditions in a simple manner.

The optical elements can be provided with an EUV absorber layer on the optically active surface, the EUV absorber layer having different thicknesses in different regions of the optically active surface. By applying the EUV absorber layer it is possible to obtain, in particular, a location-adapted intensity modulation of the electromagnetic radiation that impinges on the optical element. At the partial regions having a high thickness of the absorber layer, on account of the greater energy input there in comparison with the partial regions having a smaller thickness of the EUV absorber layer, it is necessary to effect cooling to different extents.

The optical element can also be a facet mirror having a plurality of individual mirror facets. In this case, a micro cooler having cooling channels can be integrated in at least one individual mirror facet. In this case, the desired spatially resolved cooling is achieved by individual or groups of individual mirror facets being cooled to different extents.

The micro cooler can be integrated below a mirroring surface of the individual mirror facet and generally has the function of counteracting the thermal energy input as much as possible at the originating location.

The mirror carrier of an individual mirror facet, that is to say that part of the individual mirror facet which carries the mirroring surface, can contain the feed and discharge lines for coolant.

The feed line can open, for example, in the region of the centre of the individual mirror facet and the discharge line can be connected to a circularly embodied edge channel.

It is possible to produce the cooling channels by etching or micro milling.

The mirror carrying body of the facet mirror, that is to say that body into which the individual mirror facets are integrated, can also be connected to further cooling components.

In this case, the cooling components of the mirror carrying body can likewise be configured in such a way that the mirror carrying body can be cooled to a greater extent in at least one partial region than in a further partial region. The spatially resolved cooling can be improved further by this measure.

In addition, temperature sensors can also be integrated in the optical elements, as a result of which it is possible to achieve, for example, an open-loop/closed-loop control of the temperature distribution over the optical element.

In the case of a planned thermal load change in association with a change in the illumination setting, the occurring deformations to be expected in this case can also be prevented by a cooling flow. This is effected e.g. via a suitable temporal parameter selection for the open-loop and closed-loop control of the relatively sluggish cooling circuit.

Figure 2:
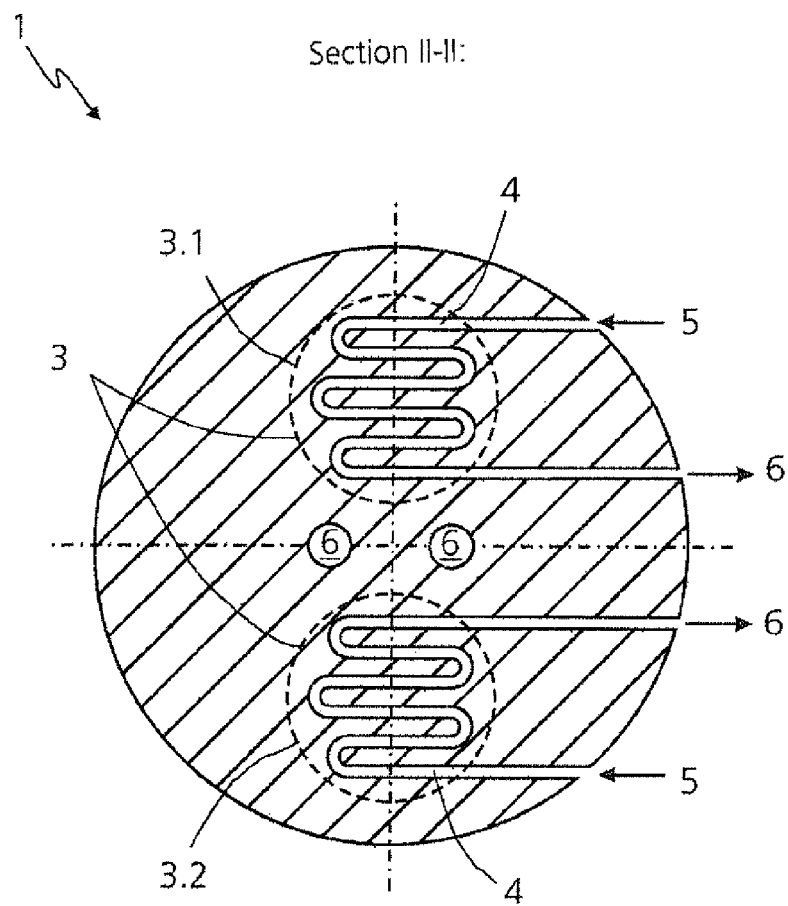
Figure 3A:
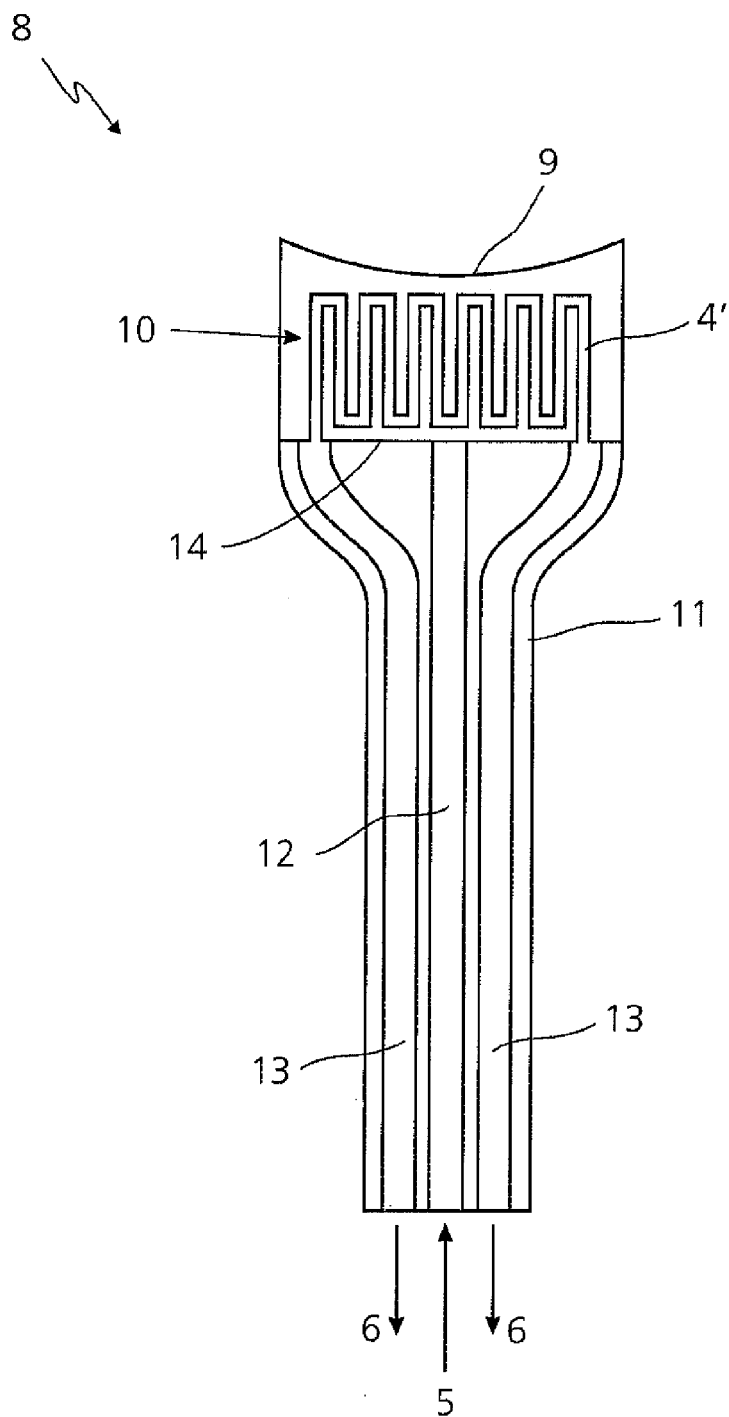
Figure 3B:
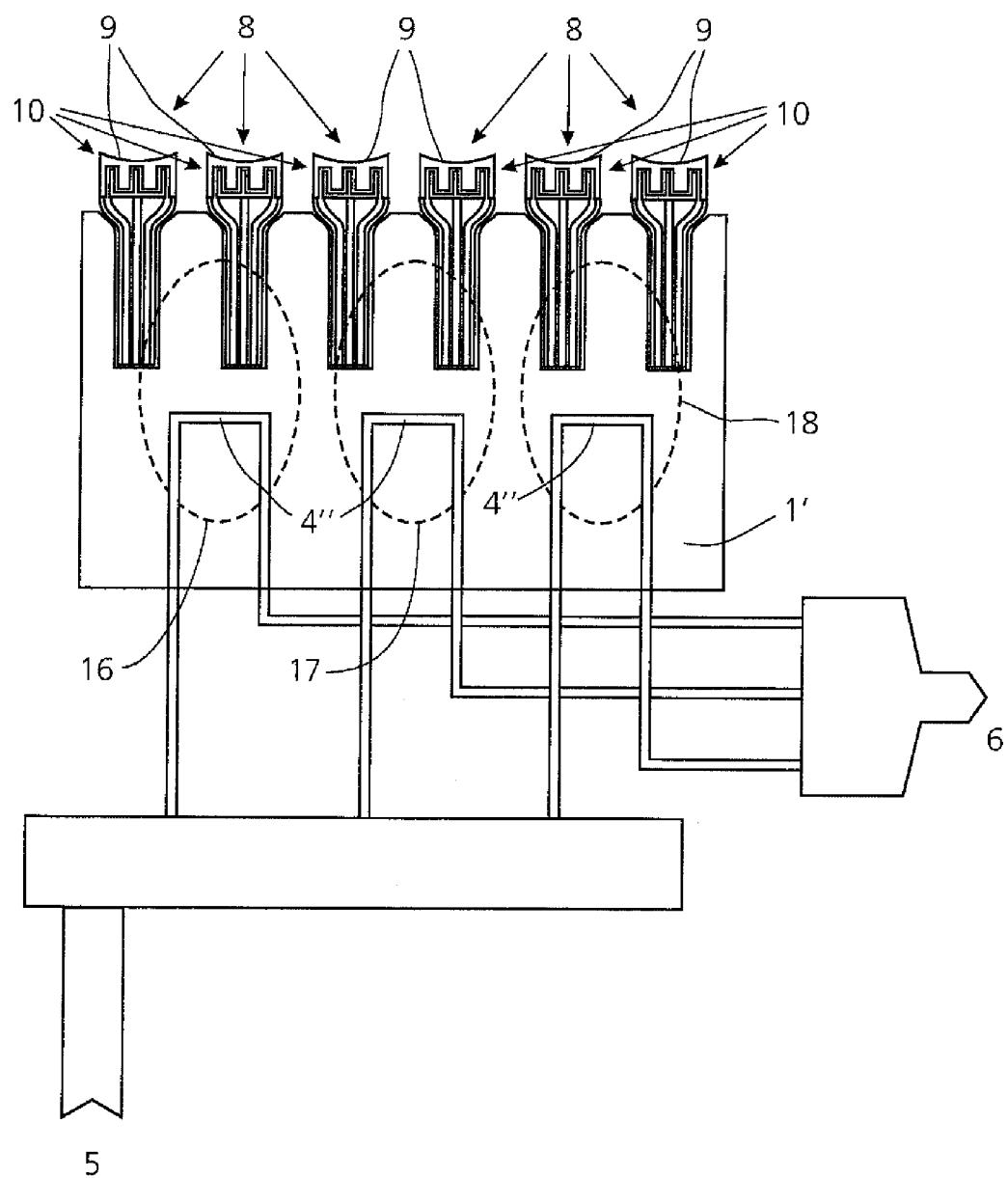
Figure 4:
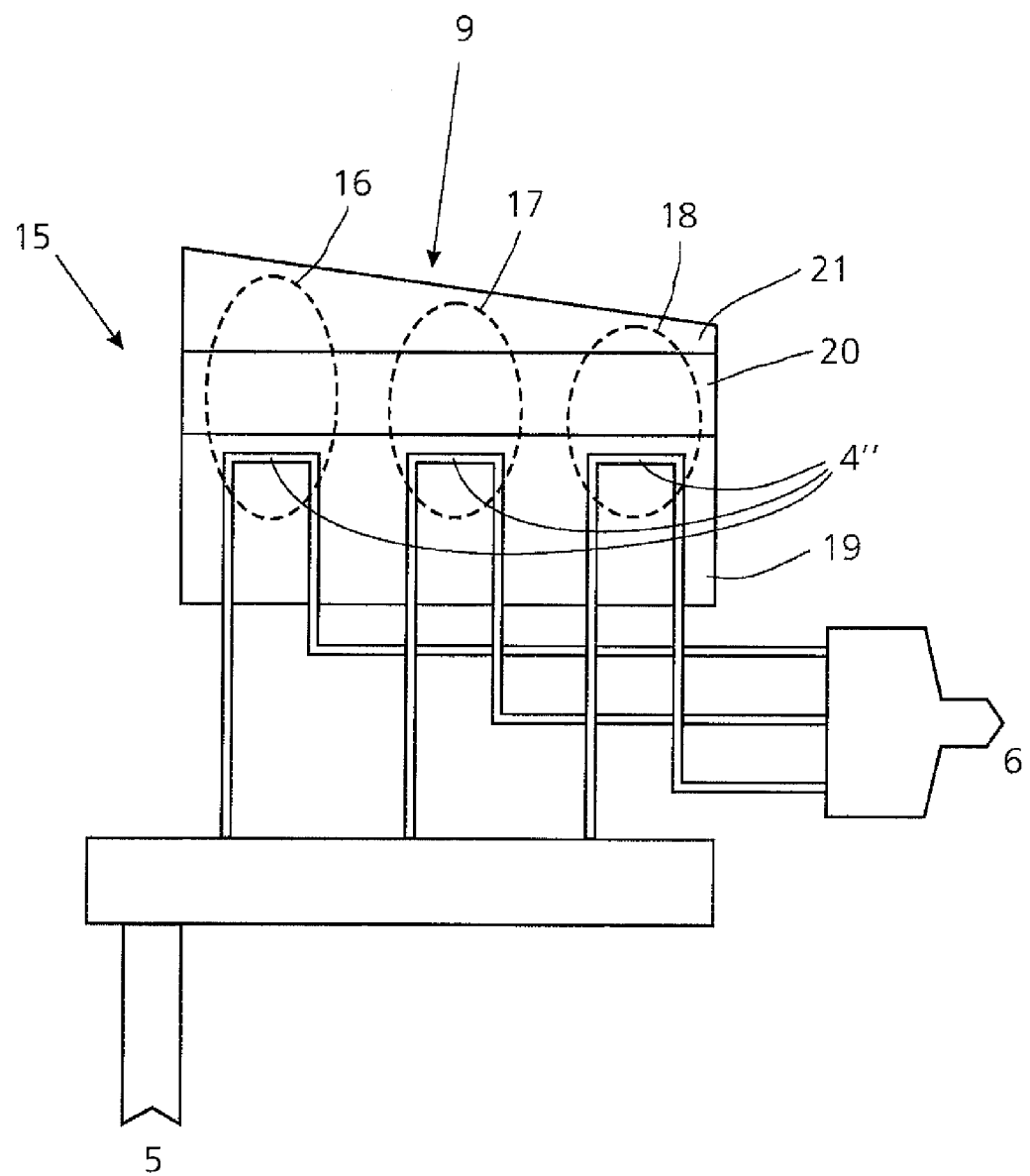
Figure 5:
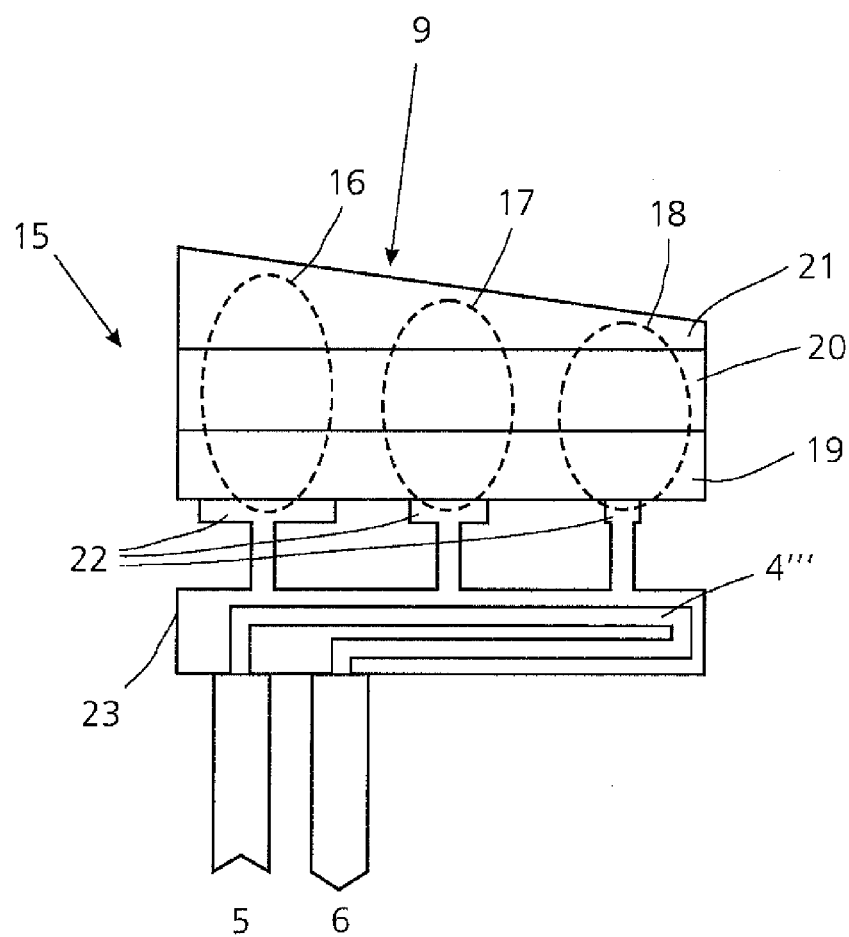
Figure 6:
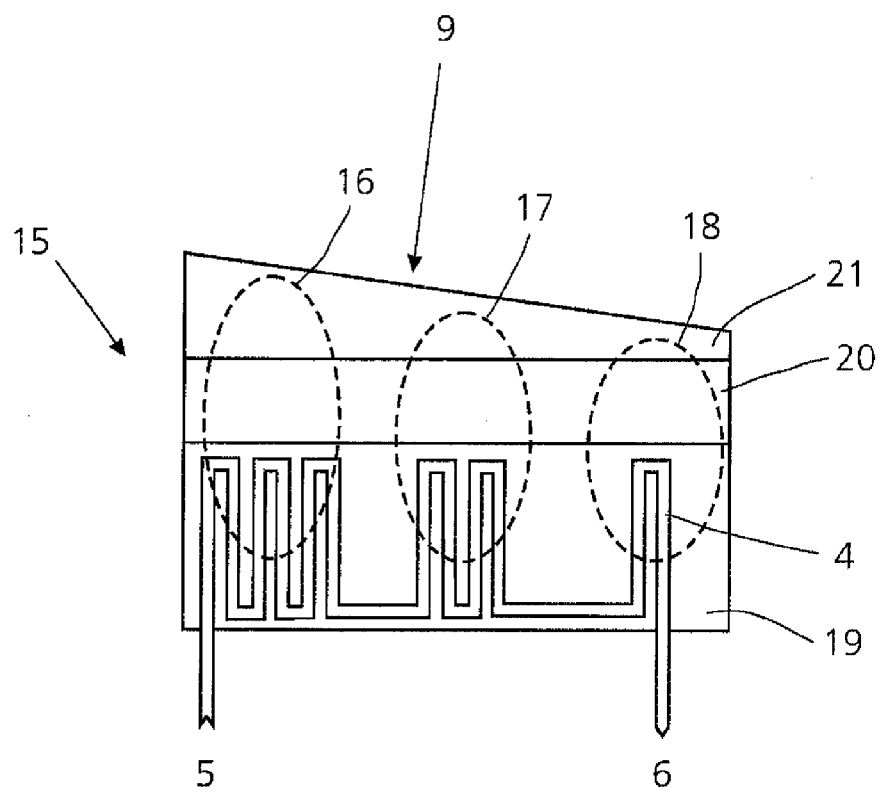

An exemplary embodiment of the invention is explained in greater detail below with reference to the drawing, in which:

FIG. 1 shows a cooling body with a first cooling zone for an annular thermal load, FIG. 2 shows the cooling body with a second cooling zone for a dipole-type thermal load, FIG. 3a shows an optical individual mirror facet into which a micro cooler is integrated, FIG. 3b shows a mirror carrying body of a facet mirror with three cooling zones and six implemented individual mirror facets, FIG. 4 shows an optical multilayer mirror with a locally different EUV absorptivity and with three cooling zones, wherein the parameters of the individual partial cooling circuits can be adapted, FIG. 5 shows an optical multilayer mirror with a locally different EUV absorptivity and with three cooling zones, wherein the contact areas with respect to the optical multilayer mirror are fashioned locally differently, FIG. 6 shows an optical multilayer mirror with a locally different EUV absorptivity and with three cooling zones, wherein the geometries of the cooling channels are fashioned locally differently.

For the spatially resolved cooling of these heat distributions at the optical elements, a cooling body 1, 23 (FIGS. 1, 2 and 5) is used here. The cooling body 1 shown can, for example, be fitted to a facet mirror or to a deflection mirror or be embodied as a mirror carrier of an EUV deflection mirror (FIGS. 4 and 6). The possibility of integrating a micro cooler 10 into an individual mirror facet 8 is shown in FIG. 3a.

FIG. 1 and FIG. 2 show the cooling body 1 with cooling channels 4 introduced in the two cooling zones 2 and 3, wherein the first cooling zone 2 is designed for an annular thermal load and the second cooling zone 3 is designed for a dipole-type thermal load. FIG. 1 does not illustrate the optically active surface of the optical element; in the example shown, the optically active surface is situated in the region indicated by the arrow 7. The cooling zone 3 is situated along the depicted z-direction in a plane situated at a deeper level in comparison with the cooling zone 2. In the cooling body 1, it is additionally possible also to implement cooling channels such as are used in accordance with the prior art for homogeneous cooling and which do not serve for locally adapted cooling. FIG. 1 shows a cooling body 1 wherein only the cooling channels 4 provided for the locally adapted cooling are depicted. Advantageous materials of the cooling body 1 can be, for example, steel, aluminium, ceramic and copper. The cooling channels 4 shown here are embodied substantially in meandering fashion, but can also have, for example, straight or circular sections. Machining production methods as well as eroding and/or etching methods and also casting and moulding methods can be used for producing the cooling channels 4. A further possibility (not shown here) consists of the connection of cooling lines, which then correspond to the cooling channels 4, to the cooling body 1, e.g. in the region of an optically non-active surface of the associated optical element. The connection of the cooling liens (not illustrated here) to the cooling body 1 can be effected e.g. by welding, soldering, bonding or else by other connection techniques. Embodiments are possible in which the cooling is performed via cooling lines implemented exclusively into the cooling body 1, via cooling channels 4 implemented exclusively into the cooling body 1, or via a combination of implemented cooling lines and cooling channels 4. The cooling channels 4 illustrated in FIG. 1 and FIG. 2 or else the cooling lines (not illustrated) are in each case connected via an inlet 5 and an outlet 6 to a cooling circuit (not depicted in the drawing), such that a cooling medium can flow from the inlet 5 to the outlet 6 through the cooling channels 4. The cooling medium can be, for example, water, glycol or liquid metal. The tube diameter can be in the range of approximately 5 mm to 9 mm and the volumetric flow rate of the cooling medium can be 3 litres per minute, for example. The pressure losses are intended not to exceed a value of approximately 1 bar for each cooling circuit.

By way of example, in FIG. 1 the cooling body 1 is subjected to an annular thermal load, which is indicated by the curved arrows 7 in FIG. 1. For cooling purposes it is possible to use here, in particular, the first cooling zone 2, wherein a cooling medium flows through the cooling channels 4 of the cooling zone 2. For cooling heat distributions caused by a different annular illumination setting with a plurality of ring-shaped illuminated regions, further cooling zones can also be introduced into the cooling body 1, which then run in addition to the ring-shaped cooling zone 2 along a ring having a smaller or a larger diameter. Merely by way of example, one ring-shaped cooling zone 2 is provided in the cooling body 1 in FIG. 1.

The sectional illustration I-I in FIG. 1 shows, in a plan view, the meandering course of the cooling channel 4 in the ring-shaped cooling zone 2.

It can be helpful to design the cooling body 1 at the same time with differently configured cooling zones. This is advantageous particularly when the thermal loading of the optical element changes over time.

FIG. 2 shows, as section II-II, the cooling body 1 illustrated in FIG. 1 in a plane situated at a deeper level along the depicted z-direction with the second cooling zone 3. The cooling zone 3 consists of the partial cooling zones 3.1 and 3.2, which together form a dipole-type arrangement. In the case of a dipole-type thermal load, the cooling zone 3 can be used to compensate for the asymmetrical heat distribution in the cooling body in a location-adapted manner. The cooling zone 3 likewise has an inlet 5 and an outlet 6, into and out of which the cooling medium can respectively flow. The cooling channels 4 of the cooling zone 3 are connected to the cooling circuit (not illustrated in the drawing).

For the purpose of cooling the locally different heat distribution, alongside the separate use of the different cooling zones 2 and 3, there is, in particular, also the possibility of combined use of the cooling channels 4 in the cooling zones 2 and 3 in order also to be able to react to other illumination settings. The individual cooling zones 2 and 3 and also the individual cooling channels 4 are designed for rapid changeover. In other words, in the case of this embodiment, the individual cooling channels 4 and, if appropriate, the cooling lines of the cooling zones 2 and 3 can be disconnected from the cooling circuit or connected thereto in a short time. The cooling system established by the cooling body 1 and by the cooling circuit is generally temporally sluggish. When a planned change in illumination setting is carried out, therefore, in this case the second cooling zone 3 is supplementary connected during a temporally limited cooling flow with respect to the first cooling zone 2.

In order to determine the temperature in the individual cooling zones 2 and 3, temperature sensors can additionally also be implemented there, which can also be used by the open-loop and closed-loop control of the cooling system.

The flow in the cooling channels 4 can either be laminar or turbulent or assume intermediate states. In this case, a turbulent flow has the advantage of more efficient cooling relative to a laminar flow. However, care must be taken to ensure that the flow of the cooling medium does not induce any mechanical oscillations which are undesirable in the optical exposure process. For the purpose of homogeneously cooling an areal region of the cooling body 1, cooling channels 4 operating according to the countercurrent principle can also be implemented, in particular.

The heat distribution at the individual optical elements is generally also dependent on the material thereof and the component geometry thereof. The use of empirical values, experimental measurements and also FEM calculations are advantageous for determining the spatially resolved heat distribution and the local deformations that occur, and for designing the cooling body 1 with the cooling channels 4 and for designing the open-loop and closed-loop control.

FIG. 3a shows a variant of the invention in which the principle according to the invention is applied to an individual mirror facet of a facet mirror. Such facet mirrors, which can be contained in an EUV illumination system, for example, can consist of 500 to 600 individual mirror facets 8 and are generally implemented in the holes of a mirror carrying body (not illustrated in the figure). The incident EUV radiation heats the individual mirror facet 8 and the mirror carrying body during the operation of the associated projection exposure apparatus, wherein, in particular, deformations at the optically active surfaces 9 of the individual mirror facets 8 also prove to be unfavourable for the optical illumination process. Furthermore, the entire module, consisting of mirror carrying body and many individual mirror facets, can also be deformed on account of the thermal load.

FIG. 3a illustrates an individual mirror facet 8, into which a micro cooler 10 with cooling channels 4' is integrated directly below the optically active surface 9. The cooling is thus effected substantially in very close proximity to the energy input induced by the EUV radiation, and thus counteracts the deformations at the optically active surface 9. The micro cooler 10 in the individual mirror facet 8 shown is embodied in ring-shaped fashion and has meandering cooling channels 4'. A mirror carrier 11 of the individual mirror facet 8 contains the feed line 12 and the discharge lines 13, which can be produced by etching, for example. The mirror carrier 11 is embodied here in such a way that the cooling medium flows through a central middle channel, serving as feed line 12, to the centre of the mirror. From there, the cooling medium is fed radially into the micro channels of the individual mirror facet and then via a circularly embodied edge channel to the discharge lines 13 of the mirror carrier 11. Via an inlet 5, cooling medium can thus flow through the feedline 12 to the cooling channels 4. Via the discharge lines 13, which are likewise integrated into the mirror carrier 11, the cooling medium passes from the cooling channels 4 to the two outlets 6. The inlet 5 and the two outlets 6 are connected to a cooling circuit (not illustrated more specifically here). The cooling channels 4 can be produced e.g. by etching using hydrofluoric acid and using a photomask. However, the use of the photomask for applying the structure to be etched in does not constitute a necessary step in this case. Further possibilities for introducing the structure include micro milling and embossing into a layer previously applied to the rear side of the mirror, which layer can be composed of nickel, for example. However, the preferred methods for introducing the structure are etching and micro milling, since the heat transfer can thus be effected through a homogeneous material without additional other layers. The connection of the mirror rear side 14 to the mirror carrier 11 can preferably be carried out via diffusion welding or laser bonding.

In the exemplary embodiment shown in FIG. 3b, a basic cooling of the facet mirror can also be effected via the mirror carrying body 1', wherein the latter can then be embodied as a cooling body e.g. with three individual cooling zones 16, 17 and 18 for spatially resolved cooling. By way of example, the mirror carrying body 1' here contains different cooling channels 4" in which a coolant flows. It is thus possible firstly to counteract the deformation of the entire module. The avoidance and reduction of the deformations at the optically active surfaces 9 of the individual mirror facets 8 are effected, by contrast, substantially with the integrated micro coolers 10.

FIG. 4, FIG. 5 and FIG. 6 in each case show a multilayer mirror 15 for EUV lithography with different possibilities of the spatially resolved cooling in the three cooling zones 16, 17 and 18. The multilayer mirrors 15 situated in a vacuum consist of a substrate 19, an MoSi layer 20 for reflecting EUV radiation, and an EUV absorber layer 21 having a locally different thickness. The EUV absorber layer 21 can be composed, for example, of ruthenium, molybdenum or silicon and has in the cases shown here, for example, a linear thickness gradient, such that during operation the EUV radiation is absorbed to different extents locally at the EUV absorber layer 21. The reflected radiation has, relative to the incident radiation, inter alia, an intensity modulation resulting from the absorption at the multilayer mirror 15 with EUV absorber layer 21. The thermal input as a result of the EUV radiation is thus locally different, such that temperature gradients can arise in the multilayer mirror 15, which temperature gradients, if appropriate, also lead to a strain and deformation of the multilayer mirror 15. Imaging aberrations and wavefront aberrations can thus occur in particular as a result of deformations at the optically active surface 9 of the multilayer mirrors 15.

FIG. 4 illustrates a multilayer mirror 15 with an EUV absorber layer 21 having a locally different thickness, wherein the spatially resolved cooling is effected via a suitable choice of parameters of the cooling circuit. For this purpose, the cooling circuit is divided into three partial cooling circuits, to each of which a separate cooling channel 4" is connected. This therefore results in the three cooling zones 16, 17 and 18 in this example. During operation, it is possible, in particular, to set the cooling medium, the initial temperature, the throughflow rate, and the type of distinct flow state for each cooling zone and to vary them over time. The flow state can be laminar or turbulent or assume an intermediate state. By way of example, the flow state can be influenced via adjustable valves. During operation, in particular the following two special states can also be effected, wherein, in the first case, a constant input temperature is maintained and the throughflow rates are individually adapted to the energy rate generated by the absorbed EUV radiation. In the second special state, a constant flow velocity is provided, but the input temperature of the cooling medium can be adapted differently locally. Overall, the cooling rate in the cooling zones has to counteract the spatially resolved energy input—induced by the EUV radiation. In the example shown in FIG. 4, the substrate 19 simultaneously fulfils the function of a cooling body.

FIG. 5 shows a multilayer mirror 15 with a locally different EUV absorber layer 21 and the three cooling zones 16, 17 and 18. Three connecting elements 22 each provided with a contact area of different sizes are fitted to the substrate 19. The contact areas touch the substrate 19 of the multilayer mirror 15. The substrate 19 is not provided with cooling channels 4 in this example; rather, a separate cooling body 23 is present, in which the cooling channel 4" runs. The thermal transfer coefficients are set individually in the three cooling zones 16, 17 and 18 for example via the size of the contact area between substrate 19 and cooling body 23, in order to be able to counteract the spatially resolved energy input as a result of the UV radiation.

FIG. 6 illustrates a multilayer mirror 15 with a locally different EUV absorber layer 21, wherein the cooling channels 4 in the three cooling zones 16, 17 and 18 illustrated here have a different geometry. The cooling channels 4 are embodied here in meandering fashion and have a different frequency over the gradient of the EUV absorber layer 21.

As an alternative to the illustration in FIGS. 5 and 6, in each case or else in part separate cooling circuits can also be used instead of a common cooling circuit for the cooling zones.

The invention claimed is:

1. An optical element, comprising:
   a facet mirror comprising a plurality of individual mirror facets comprising a first mirror facet and a second mirror facet,
   wherein:
   the first mirror facet comprises:
      a first mirror carrier including a first feed line for coolant and a first discharge line for coolant; and
      a first micro cooler comprising first cooling channels in fluid communication with the first feed line and the first discharge line, the first cooling channels comprising a first circular edge cooling channel;
   the second mirror facet comprises:
      a second mirror carrier including a second feed line for coolant and a second discharge line for coolant and
      a second micro cooler comprising second cooling channels in fluid communication with the second feed line and the second discharge line, the second cooling channels comprising a second circular edge cooling channel;
   the first feed line opens in a region of a center of the first mirror facet;

the first discharge line is connected to the first circular edge cooling channel;

the second feed line opens in a region of a center of the second mirror facet;

the second discharge line is connected to the second circular edge cooling channel the first micro cooler is integrated below a mirror surface of the first mirror facet;

the second micro cooler is integrated below a mirror surface of the second mirror facet; and the optical element is configured so that, during use of the optical element, an optically active surface of the facet mirror is cooled to a greater extent in a first region of the optically active surface than in a second region of the optically active surface.

2. The optical element of claim 1, wherein the first and second cooling channels are etched microchannels or micro milled microchannels.

3. The optical element of claim 1, further comprising a mirror carrying body connected to further cooling components.

4. The optical element of claim 3, wherein the further cooling components are configured so that, during use of the optical element, the mirror carrying body is cooled to a greater extent in at least one region than in a partial region.

5. The optical element of claim 1, further comprising temperature sensors.

6. An apparatus, comprising:
the optical element of claim 1,
wherein the apparatus is a projection exposure apparatus for semiconductor lithography.

7. The optical element of claim 1, wherein the first facet mirror further comprises a first EUV absorber layer having a varying thickness.

8. The optical element of claim 7, wherein the second facet mirror further comprises a second EUV absorber layer having a varying thickness.

9. The optical element of claim 1, further comprising a cooling body that supports the first and second mirror facets, wherein the cooling body has cooling channels that are distinct from the first and second cooling channels.

10. The optical element of claim 9, wherein the cooling body is configured to cool the optical element independent of the first and second micro coolers.

11. The optical element of claim 1, further comprising a cooling body that supports the first and second mirror facets, wherein the cooling body is configured to cool the optical element independent of the first and second microcoolers.

* * * * *